(12) United States Patent
Huang et al.

(10) Patent No.: US 8,304,271 B2
(45) Date of Patent: Nov. 6, 2012

(54) INTEGRATED CIRCUIT HAVING A BULK ACOUSTIC WAVE DEVICE AND A TRANSISTOR

(76) Inventors: Jenn Hwa Huang, Chandler, AZ (US); Bruce M. Green, Gilbert, AZ (US)

( * ) Notice: Subject to any disclaimer, the term of this patent is extended or adjusted under 35 U.S.C. 154(b) by 345 days.

(21) Appl. No.: 12/469,326

(22) Filed: May 20, 2009

(65) Prior Publication Data

US 2010/0295100 A1 Nov. 25, 2010

(51) Int. Cl.
*H01L 21/00* (2006.01)
(52) U.S. Cl. .......... 438/48; 257/245; 257/254; 257/275; 257/276; 257/416; 257/E27.001; 257/E27.009; 257/E27.012; 257/E27.026; 438/6; 438/50; 438/53; 438/167
(58) Field of Classification Search .................. 257/245, 257/254, 275, 416, E27.001, E27.009, E27.012, 257/E27.026; 438/48, 6, 50, 53, 167
See application file for complete search history.

(56) References Cited

U.S. PATENT DOCUMENTS

| | | |
|---|---|---|
| 7,112,860 B2 | 9/2006 | Saxler |
| 7,294,540 B2 | 11/2007 | Lee et al. |
| 7,935,620 B2 | 5/2011 | Green et al. |
| 2007/0241419 A1 | 10/2007 | Green et al. |
| 2009/0001478 A1* | 1/2009 | Okamoto ...................... 257/382 |

OTHER PUBLICATIONS

King-Yuen Wong, et al, "Planar Integration of SAW Filter with HEMT on AlGaN/GaN Heterostructure Using Fluoride-based Plasma Treatment", Department of Electrical and Computer Engineering. The Hong Kong University of Science and Technology. Hong Kong, SAR China, 2006 IEEE Ultrasonics Symposium, pp. 281-284, (2006).

A.P. Zhang, et al., "High Power GaN Electronic Devices", Department of Chemical Engineering. University of Florida, Gainesville, FL. Department of Materials Science and Engineering. University of Florida, Gainesville, FL. Microelectronics Center of North Carolina Research Triangle Park, NC.

Rich Ruby (SM), "Review and Comparison of Bulk Acoustic Wave FBAR, SMR Technology", Avago Technologies, San Jose, CA. 2007 IEEE Ultrasonics Symposium, pp. 1029-1040.

T. Nishihara, et al., High Performance and Miniature Thin Film Bulk Acoustic Wave Filters for 5 GHz, Fujitsu Laboratories Ltd., Peripheral systems Laboratories, 64 Nishiwaki, Ohkubo-cho, Akashi 674-8555, Japan. 2002 IEEE Ultrasonics Symposium, pp. 969-972.

P.G. Neudeck, "Silicon Carbide Electronic Devices", pp. 1-12, (2001).

(Continued)

*Primary Examiner* — Jay C Kim
(74) *Attorney, Agent, or Firm* — Joanna G. Chiu; Jonathan N. Geld

(57) ABSTRACT

A bulk GaN layer is on a first surface of a substrate, wherein the bulk GaN layer has a GaN transistor region and a bulk acoustic wave (BAW) device region. A source/drain layer is over a first surface of the bulk GaN layer in the GaN transistor region. A gate electrode is formed over the source/drain layer. A first BAW electrode is formed over the first surface of the bulk GaN layer in the BAW device region. An opening is formed in a second surface of the substrate, opposite the first surface of the substrate, which extends through the substrate and exposes a second surface of the bulk GaN layer, opposite the first surface of the bulk GaN layer. A second BAW electrode is formed within the opening over the second surface of the bulk GaN layer.

19 Claims, 8 Drawing Sheets

OTHER PUBLICATIONS

D. Neculoiu, et al., "Electromagnetic Modeling of Micromachined GaN Thin Films for Fbar Applications", IMT Bucharest, Bucharest, Romania. Forth-IESL-MRG, Crete Greece, TU Darmstadt, Merkstr, Darmstadt, Germany, 2005 IEEE, pp. 119-122.

Dan Neculoiu, et al., "Microwave FBAR Structures Fabricated using Micromachined GaN Membranes", IMT-Bucharest, Bucharest, Romania. FORTH-IESL-MRG Heraklion, Crete, Greece. Infineon Technologies AG, Communication Solutions, Wernerwerkstrasse, Regensburg, Germany. Institut fur Hochfrequenztechnik, Technische Univ. Darmstadt, Merckstr., Darmstadt, Germany. LAAS-CNRS Toulouse, Toulouse, France. 2007 IEEE, pp. 877-880.

Alexandru Muller, et al., Membrane Supported Millimeter Wave Circuits Based on Silicon and GaAs MicroMachining, IMT Bucharest, FORTH-Heraklion, LAAS Toulouse, CMOS Emerging Technologies Workshop, Research & Business Opportunities Ahead, Jul. 19-21, 2006, Bamff, Alberta, Canada.

R.P. Mertens, et al., "Microwave applications of advanced semiconductor technologies", IMEC, MCP-division, Leuven, Belgium, also ESAT, KULeuven, 12th GAAS Symposium—Amsterdam, 2004, pp. 205-510.

S. Mahon, et al., "Bulk Acoustic Wave Devices—Why, How, and Where They are Going", TriQuint Semiconductor, CS MANTECH Conference, May 14-17, 2007, Austin, TX, pp. 15-18.

R. Lanz, et al., "Properties of sputter deposited AlN, Mo, W and SiO2 thin-films for bulk-Acoustic-Wave applications on 200 mm Si substrates", UNAXIS BALZERS Ltd., Wafer Processing division, FL. UNAXIS Japan Co., Ltd., Wafter Processing division, Shinjuku-ku, Tokyo, (2006).

D. Krausse, et al., Robust GaN HEMT Low-Noise Amplifier MMICs for X-Band Applications, 12th GAAS Symposium—Amsterdam, 2004, pp. 71-74.

C. Jang, et al., "Device Characteristics of Radio Frequency SAW Filter Fabricated on GaN Thin Film", School of Electronic and Electrical Engineering, Kyungpook National University, Daegu, 702-701, Journal of the Korean Physical Society, vol. 42, Feb. 2003, pp. S480-S482.

R. Aigner, "Volume manufacturing of BAW-filters in a SMOS fab", Infineon Technologies AG, Secure Mobile Solutions, Munich, Germany, (2005).

B.M. Green, et al., "A GaN HFET Device Technology on 3" SiC Substrates for Wireless Infrastructure Applications", Freescale Semiconductor, Inc., IEEE Publication Date Nov. 16, 2006, pp. 706-709.

K. Mutamba et al., "Micromachined GAN-Based FBAR Structures for Microwave Applications", Proceedings of Asia-Pacific Microwave Conference 2006.

J. B. Shealy, et al., "Low-Phase Noise AlGAN/GAN FET-Based Voltage Controlled Oscillators (VCOs)", IEEE Wireless and Comp. Lett, vol. 11, No. 6, Jun. 2001, pp. 244-246.

S. Dossou, et al., "60µW SMR BAW Oscillator Designed in 65nm CMOS Technology", 2008 IEEE Symp. on Circuits and Systems, pp. 1456-1459.

IQEP website: http://www.iqep.com—About Us—"Strategic Growth and Global Positioning", (2009).

Wafer Technology Ltd., website: http://www.wafertech.co.uk/epi.htm—"'Epitaxy Ready' Polished Wafers", (2009).

\* cited by examiner

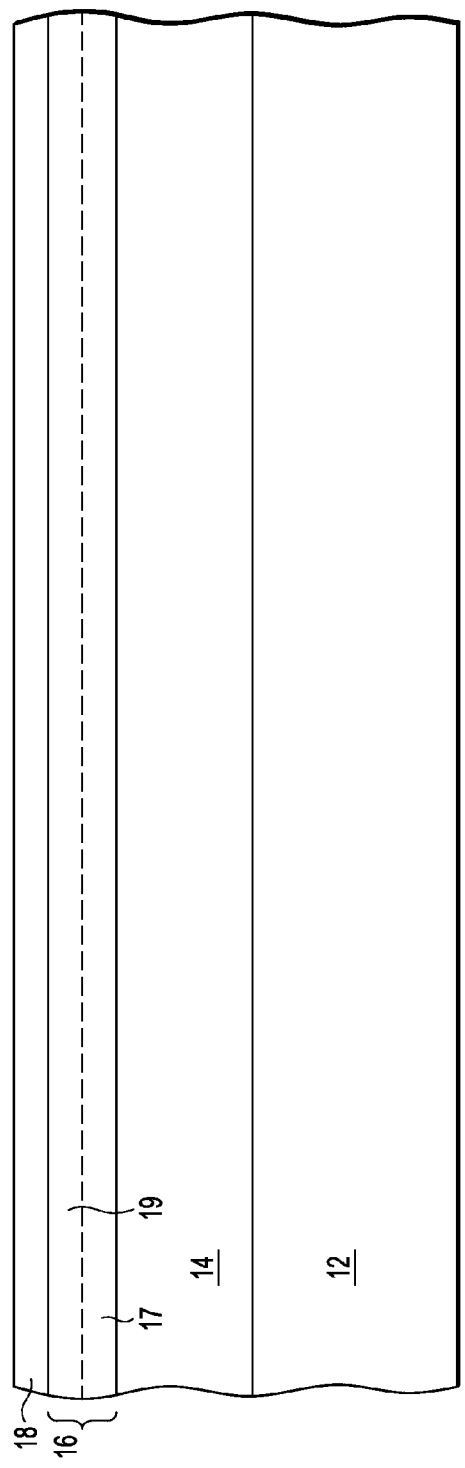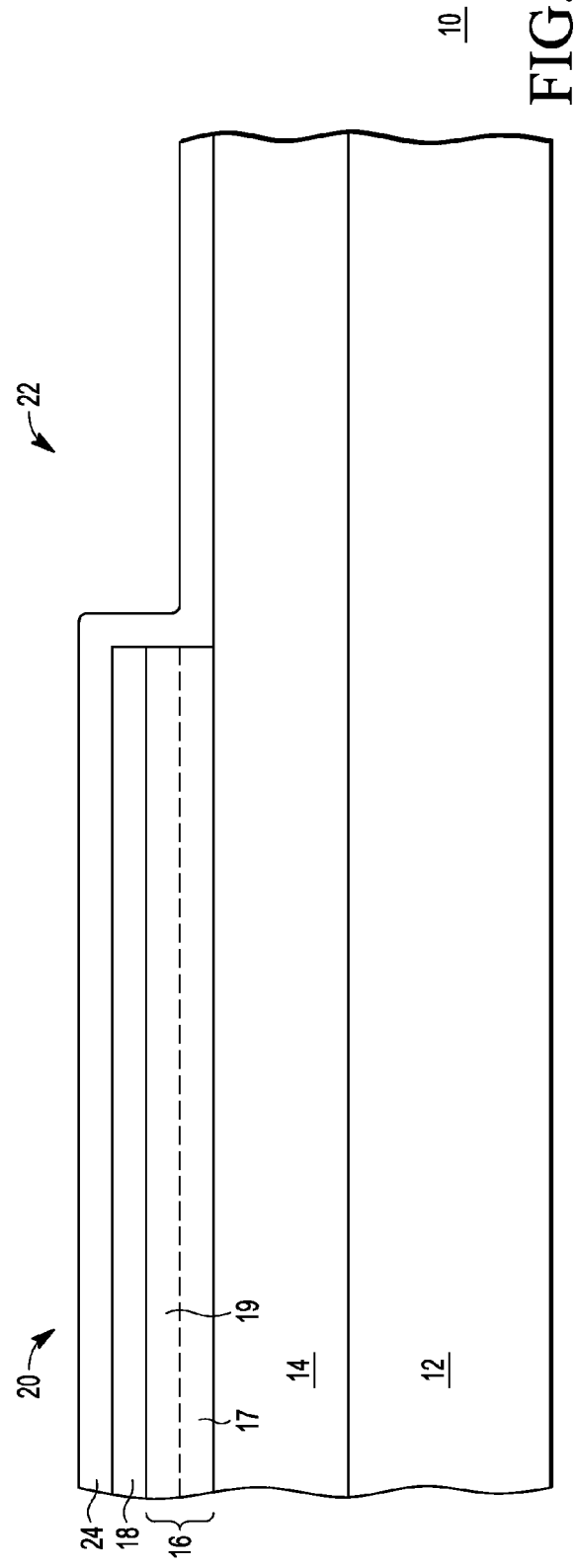

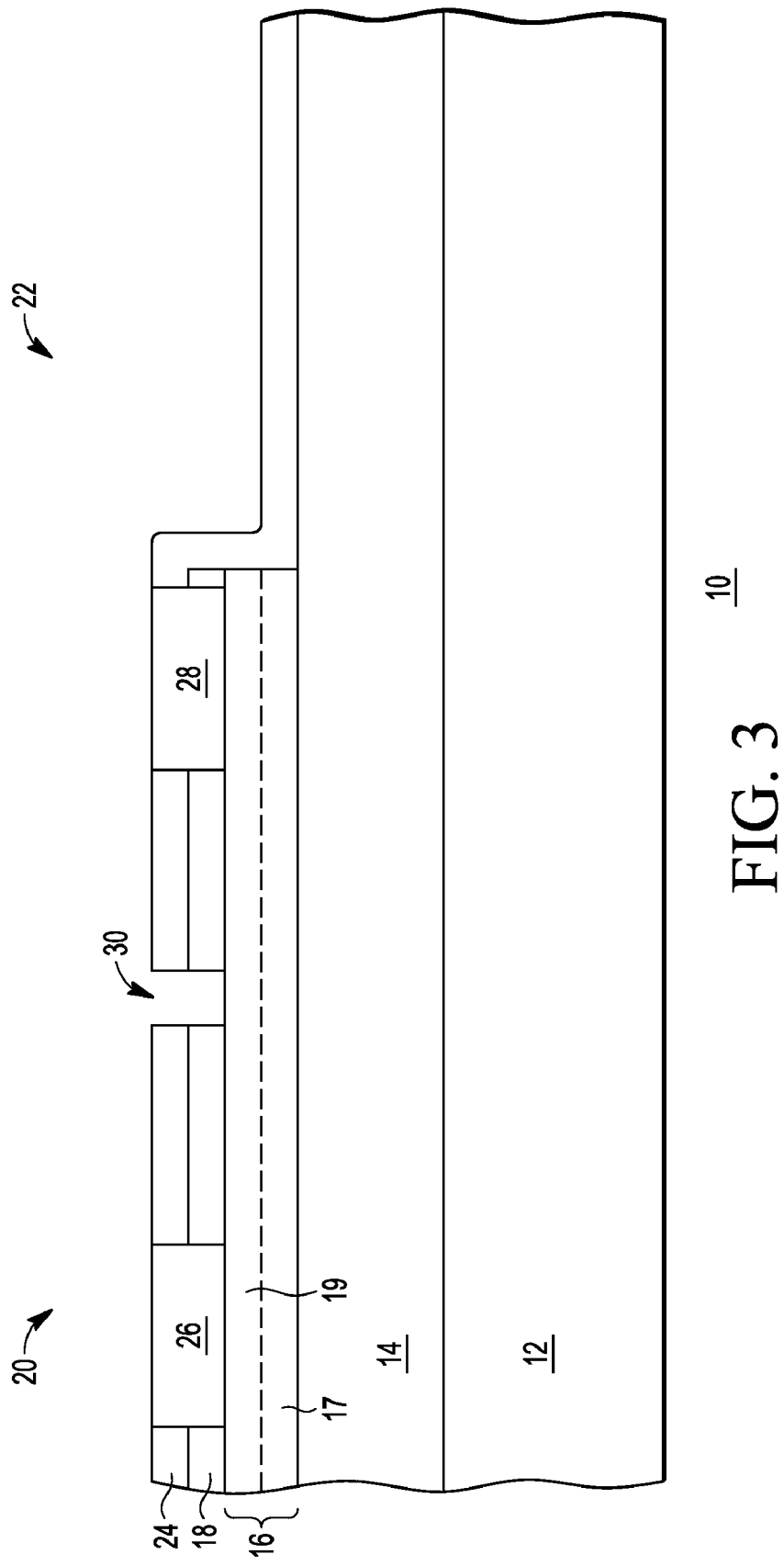

INTEGRATED CIRCUIT HAVING A BULK ACOUSTIC WAVE DEVICE AND A TRANSISTOR

BACKGROUND

1. Field

This disclosure relates generally to forming a bulk acoustic wave device and a transistor.

2. Related Art

In RF (radio frequency) applications, power amplification and filtering functions are important. Typically, filtering is achieved using an integrated circuit having a surface acoustic wave (SAW) filter and another integrated circuit having a transistor. However, as the industry desires to decrease the real estate of integrated circuits, there is a desire to have SAW filters and transistors formed on the same integrated circuit. However, SAW filters take up a lot of space and are difficult to integrate with transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 illustrates a cross-section of a portion of an integrated circuit having an epitaxially grown layer in accordance with an embodiment;

FIG. 2 illustrates the portion of the integrated circuit of FIG. 1 after defining a first region and a second region in accordance with an embodiment;

FIG. 3 illustrates the portion of the integrated circuit of FIG. 2 after forming a portion of a transistor in the first region in accordance with an embodiment;

DETAILED DESCRIPTION

Figure 4:
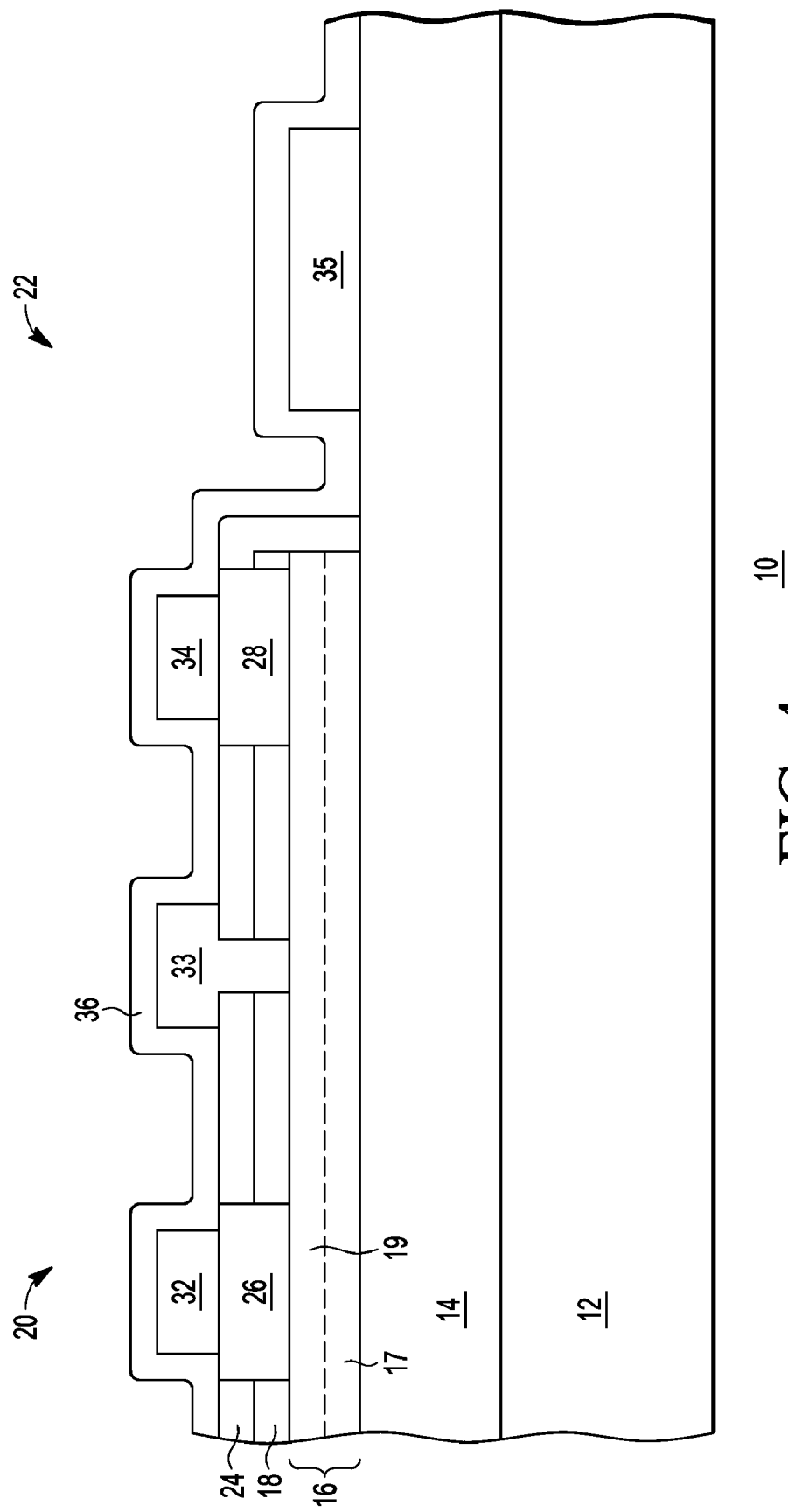
FIG. 4 illustrates the portion of the integrated circuit of FIG. 3 after forming a first metal layer and a first interlayer dielectric layer in accordance with an embodiment.

By integrating a bulk acoustic waver (BAW) device, which is more compact than an SAW filter and has improved performance at frequencies greater than 2 GHz unlike the SAW filters, with a GaN transistor, an improved RF integrated circuit can be achieved. The use of an epitaxial GaN layer improves the performance of a BAW resonator. GaN is an expensive material and RF devices are still typically manufactured on small wafers (approximately 3 inch wafers) so the use of a smaller device saves cost and allows for manufacturing to still continue using small wafers. Furthermore, through vias are used in the integration. Hence, bulk micro-machined GaN BAW filters are integrated with GaN transistors to reduce the total device area provided by integrating these two functions on one integrated circuit chip.

FIG. 1 illustrates a portion of an integrated circuit 10 in accordance with an embodiment. The integrated circuit 10 includes a semiconductor substrate 12, a GaN layer 14, a barrier layer 16, which may also be referred to as a source/drain layer because it is the layer in which the source and drain of the transistor are formed and a first passivation layer 18. The semiconductor substrate 12 may be sapphire, Si, SiC, diamond, GaN, AlN and various other generally semiconductor materials. It is desirable that substrate 12 be substantially electrically insulating. In a preferred embodiment, the semiconductor substrate 12 is SiC because, as will be better appreciated after further discussion, the barrier layer 16 can be epitaxially grown on SiC and the GaN layer 14, respectively. It may be preferred to use a SiC substrate instead of a silicon substrate because when growing the GaN layer 14 on the silicon substrate strain compensation layers, such as AlN, are often needed.

The GaN layer 14 is formed through an epitaxial growth process on the substrate 12. To make the GaN layer 14 semi-insulating it may be doped during the growth process with a dopant, such as iron or carbon. In one embodiment, the GaN layer 14 has a thickness of approximately 1,000 to 100,000 Angstroms, or more preferably approximately 20,000 Angstroms. In one embodiment, the entire GaN layer 14 is grown in one process without other layers being formed and hence is a bulk GaN layer.

The barrier layer 16, which is formed on the GaN layer 14, may include one or more layers. In one embodiment, the barrier layer 16 includes a layer of GaN 19 formed over a layer of AlGaN 17. Other suitable materials, such as other layers like InGaN, InAlN may be used. In one embodiment, the AlGaN has the chemical formula of $Al_xGa_{1-x}N$, wherein x is preferably in the range of about $0.2 \leq x \leq 0.3$, and having a useful thickness approximately between 50 and 400 Angstroms, or more specifically 150-250 Angstroms. The GaN may be a cap or surface termination layer with a thickness between approximately 5 and 80 Angstroms, or more preferably 10-40 Angstroms. GaN is a III-V compound, but other type IV, III-V, II-VI and organic semiconductor materials may also be used. The source/drain layer 16 can be formed by metal-organic chemical vapor deposition (MOCVD), molecular beam epitaxy (MBE), hydride vapor phase epitaxy (HVPE), the like, or a combination of the above. Because of the spontaneous polarization characteristics of GaN, when the source/drain layer 16 is formed over the GaN layer 14, the channel region will be formed (during operation) at the interface between the GaN layer 14 and the barrier layer 16 and the barrier layer 16 includes the source and drain regions.

After forming the barrier layer 16, the first passivation layer 18 is formed. In one embodiment, the semiconductor substrate 12 can be purchased with various layers, such as the GaN layer 14 and the barrier layer 16 already formed on the substrate 12. The first passivation layer 18 protects the barrier layer 16 and the GaN layer 14 during subsequent processing. In one embodiment, the first passivation layer 18 is SiN, having a thickness between 50 to 10000 Angstroms and is formed by physical deposition (PD) or chemical vapor deposition (CVD) method with low impurity content. Such impurities include hydrogen, carbon, etc.

FIG. 2 illustrates the portion of the integrated circuit of FIG. 1 after defining a first region 20 and a second region 22 in accordance with an embodiment. The first region 20 is a GaN transistor region, which is where a GaN transistor will be formed, and the second region 22 is a BAW device region, which is where a BAW device will be formed. The GaN transistor region 20 is adjacent the BAW device region 22. The GaN transistor region 20 is formed by patterning, such as etching, the passivation layer 18, and the barrier layer 16 so that these layers are removed in the BAW device region but remain in the GaN transistor region 20. In one embodiment, during the patterning of the passivation layer 18 and the barrier layer 16, a portion of the GaN layer 14 may also be removed. For example, in one embodiment, partial etching of the GaN layer 14 results in 1,000 to 100,000 Angstroms remaining of the GaN layer 14. In other words, the patterning of the barrier layer 16 and a portion of the GaN layer 14, if performed, defines the GaN transistor region 20 and the BAW device region 22. Hence, the GaN transistor region 20 and the BAW device region 22 are electrically isolated; the regions are preferably also physically isolated so that the stress wave from the BAW device region 22 does not interfere with the GaN transistor region 20.

In another embodiment, other processes may be used to electrically isolate the GaN transistor region 20 from the BAW device region 22. For example, ion implantation of an appropriate implant species such as oxygen, helium, nitrogen, or beryllium at the interface between the GaN transistor region 20 and the BAW device region 22 can be used to perform the desired electrical isolation. In another embodiment, electrical (and physical) isolation between the GaN transistor 20 region from the BAW device region 22 can be achieved by forming a trench isolation structure between the two regions. A trench isolation structure can be formed by etching through all layers to the substrate 12. A reactive ion etching (RIE), inductively coupled plasma etching (ICP), the like, or combinations of the above may be used.

After patterning, a second passivation layer 24 is formed in the GaN transistor region 20 and the BAW device region 22. The second passivation layer 24 may be 20 to 5000 Angstroms, or more specifically 500 to 1000 Angstroms of SiN formed by PD or CVD. The second passivation layer 24 is in contact with the first passivation layer 18 in the GaN transistor region 20 and the GaN layer 14 in the BAW device region 22. The second passivation layer 24 protects the GaN layer 14 in the BAW device region 22.

FIG. 3 illustrates the portion of the integrated circuit of FIG. 2 after forming a portion of a transistor in the first region in accordance with an embodiment. The first passivation layer 18 and the second passivation layer 24 are etched to form openings (not illustrated) for the source and drain contacts. The openings can be formed by using an etching chemistry including $SF_6$ or $CF_4$ in a plasma etch process. In one embodiment, the openings are filled with an ohmic contact metal stack, such as TiAlMoAu, followed by a thermal anneal to form the source contact 26 and the drain contact 28. The thermal anneal causes the ohmic metal stack to form an eutectic alloy that interacts with the barrier layer 16 to access the channel formed (during operation) at the interface between the GaN layer 14 and the barrier layer 16. The source contact 26 and the drain contact 28 are ohmic contacts to the channel formed underneath the barrier layer 16.

After forming the source contact 26 and the drain contact 28, a gate opening 30 is formed in the first passivation layer 18 and the second passivation layer 24. The gate opening 30 is where the gate electrode for the GaN transistor will be formed. The same etch chemistry used for forming the openings for the form the source contact 26 and the drain contact 28 can be used. It is desirable that the etching process for forming the gate opening 30 is designed so that a minimum amount of surface damage occurs to the layer that is exposed at the bottom of the gate openings 30.

FIG. 4 illustrates the portion of the integrated circuit of FIG. 3 after forming a first metal layer 32-35 and a first interlayer dielectric layer 36 in accordance with an embodiment. The first metal layer may include more than one metal layer. For example, the first metal layer may include a layer of 100-1000 Angstroms of Ni formed under a 2000 Angstrom to 1 micron layer of gold, which are subsequently patterned to form the patterned metal layers 32-35. The patterned metal layers 32-35 include the gate electrode 33 and the BAW top electrode 35. In other embodiments, the metal layer is used to form the patterned metal layers 32, 34, and 35, but not the gate electrode 33. In another embodiment the metal layer is not used to form the BAW top electrode 35. Hence, the gate electrode 33 may be a different material than the BAW top electrode 35 and/or the patterned metal layers 32 and 34. The source/drain layer 16 serves as a Schottky layer for the gate electrode 33. A first interlayer dielectric (ILD) layer 36 is formed over the first metal layer 32-35. The first ILD layer 36 can be any suitable dielectric layer, such as SiN, TEOS, or silicon dioxide. The first ILD layer 36 may be 200 to 10,000 Angstroms and can be formed by any suitable process, such as a chemical vapor deposition process.

Figure 5:
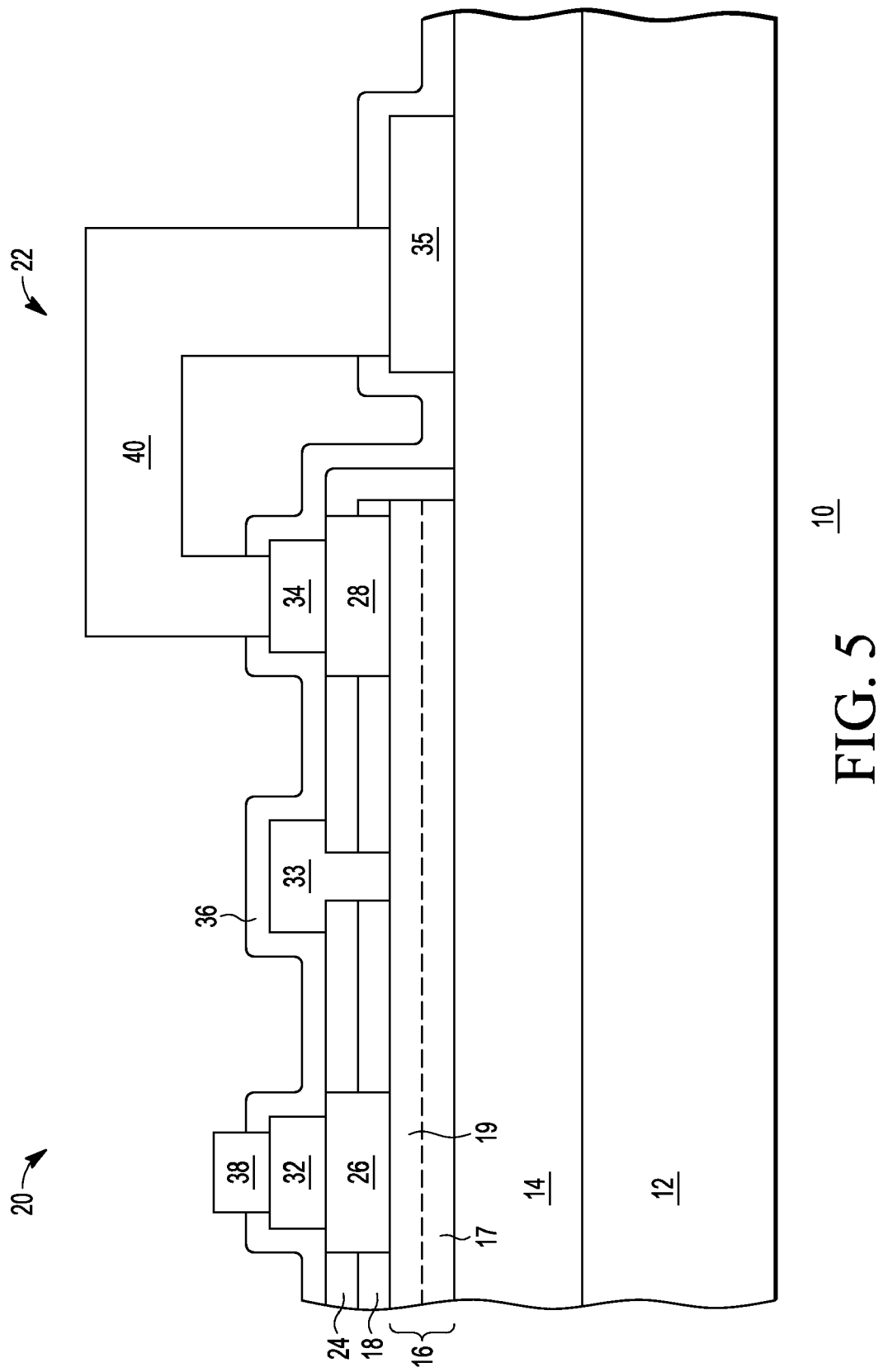
FIG. 5 illustrates the portion of the integrated circuit of FIG. 5 after forming a second metal layer in accordance with an embodiment.

After forming the first ILD layer 36, portions of the first ILD layer 36 that are over the patterned first metal layers 32 and 34 are removed using conventional etching and a second patterned metal layer 38 and 40 is formed, as illustrated in FIG. 5. The second patterned metal layer 38 and 40 can be any suitable conductive material, such as the same materials and processes used for the first patterned metal layer. The second patterned metal layer 38 is a contact to the source region of the GaN transistor. The second patterned metal layer 40 couples the drain of the GaN transistor to the GaN BAW top electrode 35. A skilled artisan understands that the second patterned metal layer 40 as illustrated is shown in a schematic view and not how it may actually appear in cross-section. For example, the second patterned metal layer 40 most likely will be formed in contact with the first ILD layer 36 and may extend in directions in and out of the page so that the second patterned metal layer 40 is coupled to the BAW top electrode 35. Although not illustrated, additional metal layers and ILD layers may be formed at this point in processing, later during process, or not at all.

Figure 6:
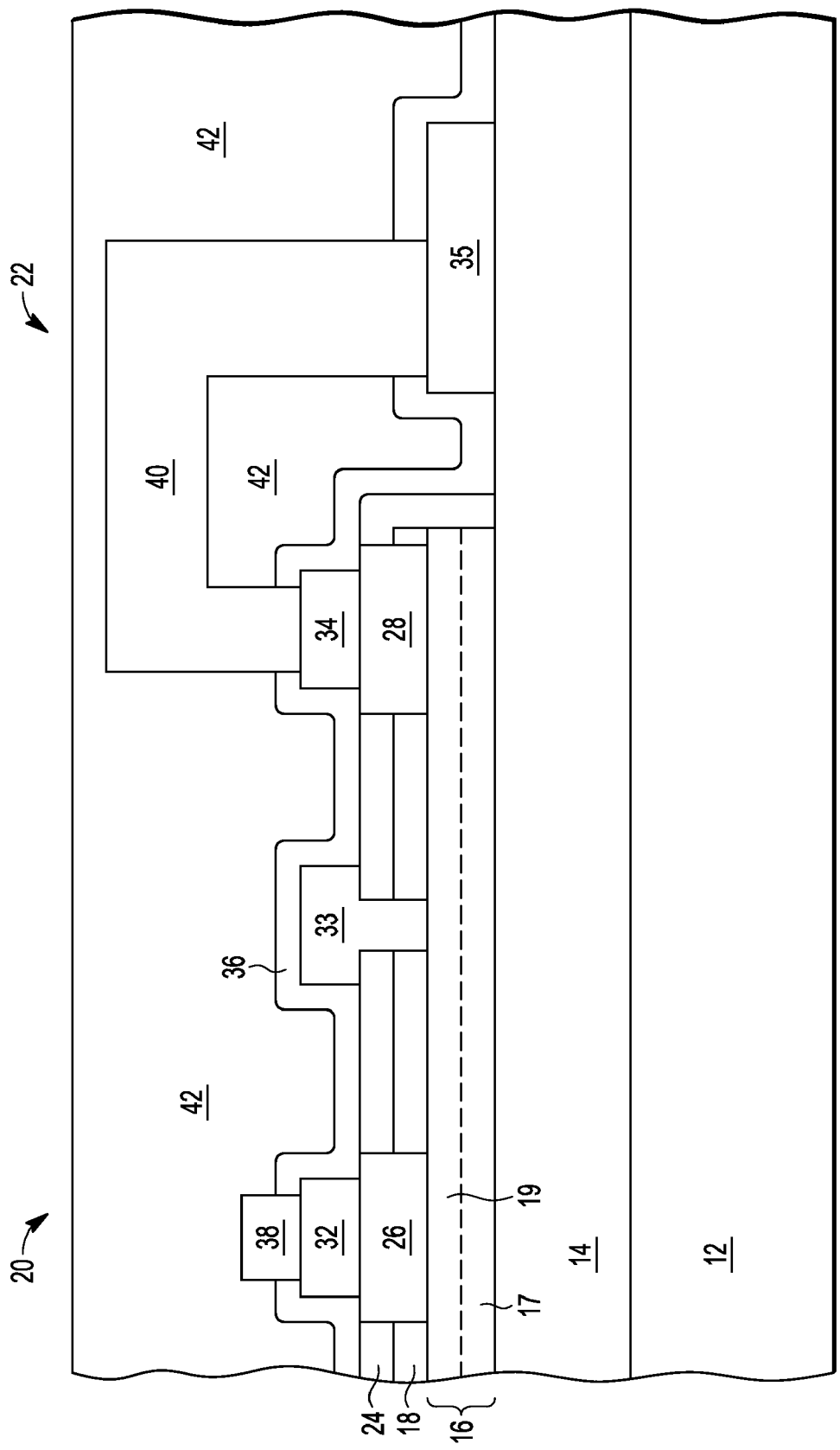
FIG. 6 illustrates the portion of the integrated circuit of FIG. 5 after forming a sacrificial layer in accordance with an embodiment.

Next, an adhesive layer 42, which is a sacrificial layer, such as wax, thick photo-resist, heat sensitive epoxy and the like, is formed over the integrated circuit 10, as illustrated in FIG. 6. The sacrificial layer 42 may be formed by spin coating or by lamination of the adhesive material to the wafer. The adhesive layer 42 is formed to planarize the surface of the integrated circuit 10 where the above processing occurred and/or to mount the integrated circuit 10 to a carrier 44 (FIG. 5).

Figure 7:
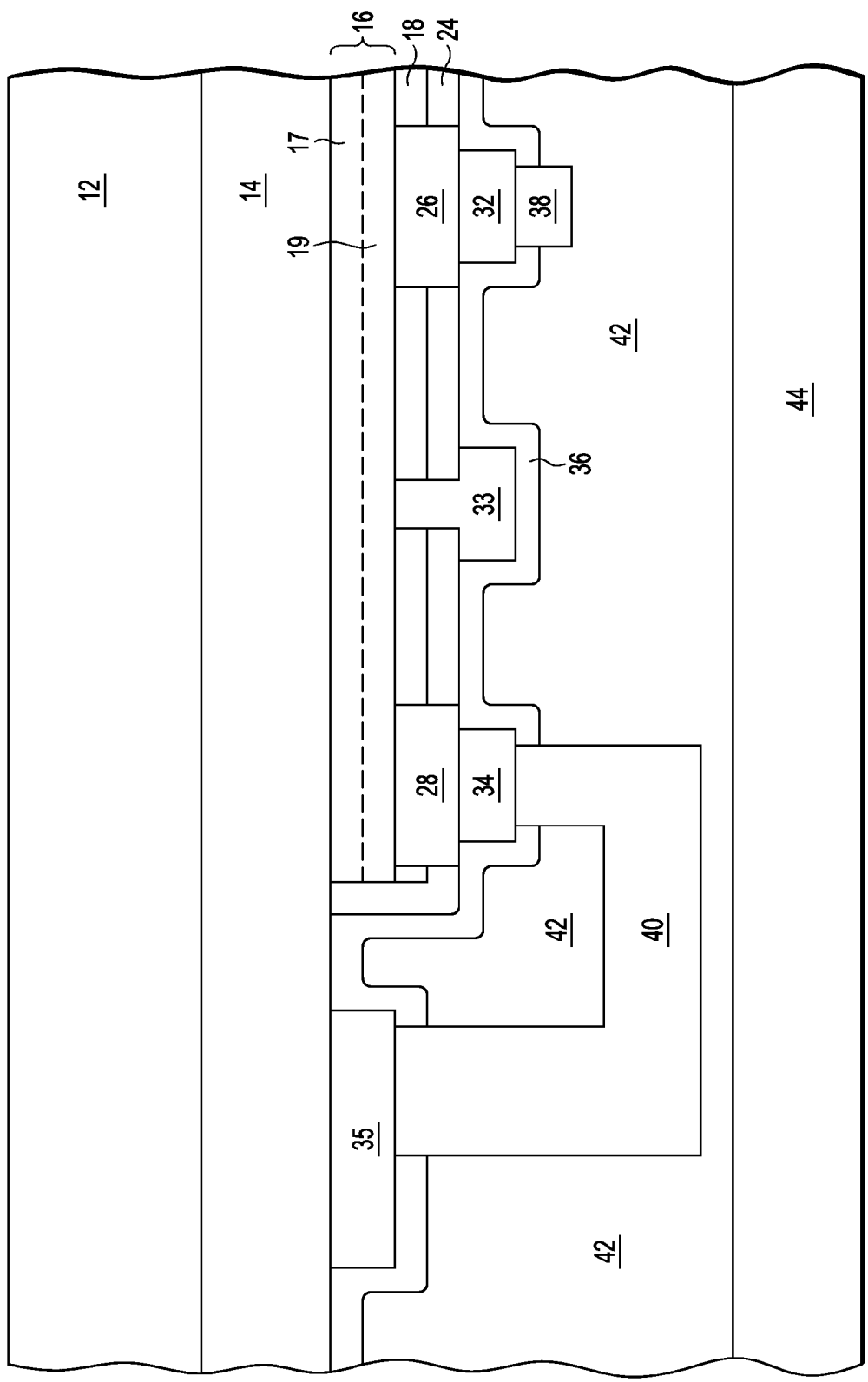
FIG. 7 illustrates the portion of the integrated circuit of FIG. 6 after attaching the portion of the integrated circuit to a carrier and thinning the substrate in accordance with an embodiment.

After forming the adhesive layer 42, a carrier 44 is attached to the exposed surface of the adhesive layer 42 and the substrate 12 is thinned, as illustrated in FIG. 7. To achieve this and the subsequent processing, the integrated circuit 10 may be turned upside down during processing so that the carrier 44 is at the bottom (or closest to the floor during manufacturing). In one embodiment, the carrier 44 is a sapphire carrier, which may be 500 microns thick. The carrier 44 is attached to the wafer using the adhesive layer 42 by pressure and thermal bonding using an appropriate tool. In one embodiment, the substrate 12 is thinned during a mechanical grind or lap process or a chemical mechanical polishing (CMP) process. The substrate 12 is thinned so that subsequent etching through the substrate 12 is reduced. In one embodiment, the substrate 12 before thinning is 200 to 500 microns and is thinned to 25 to 200 microns.

Figure 8:
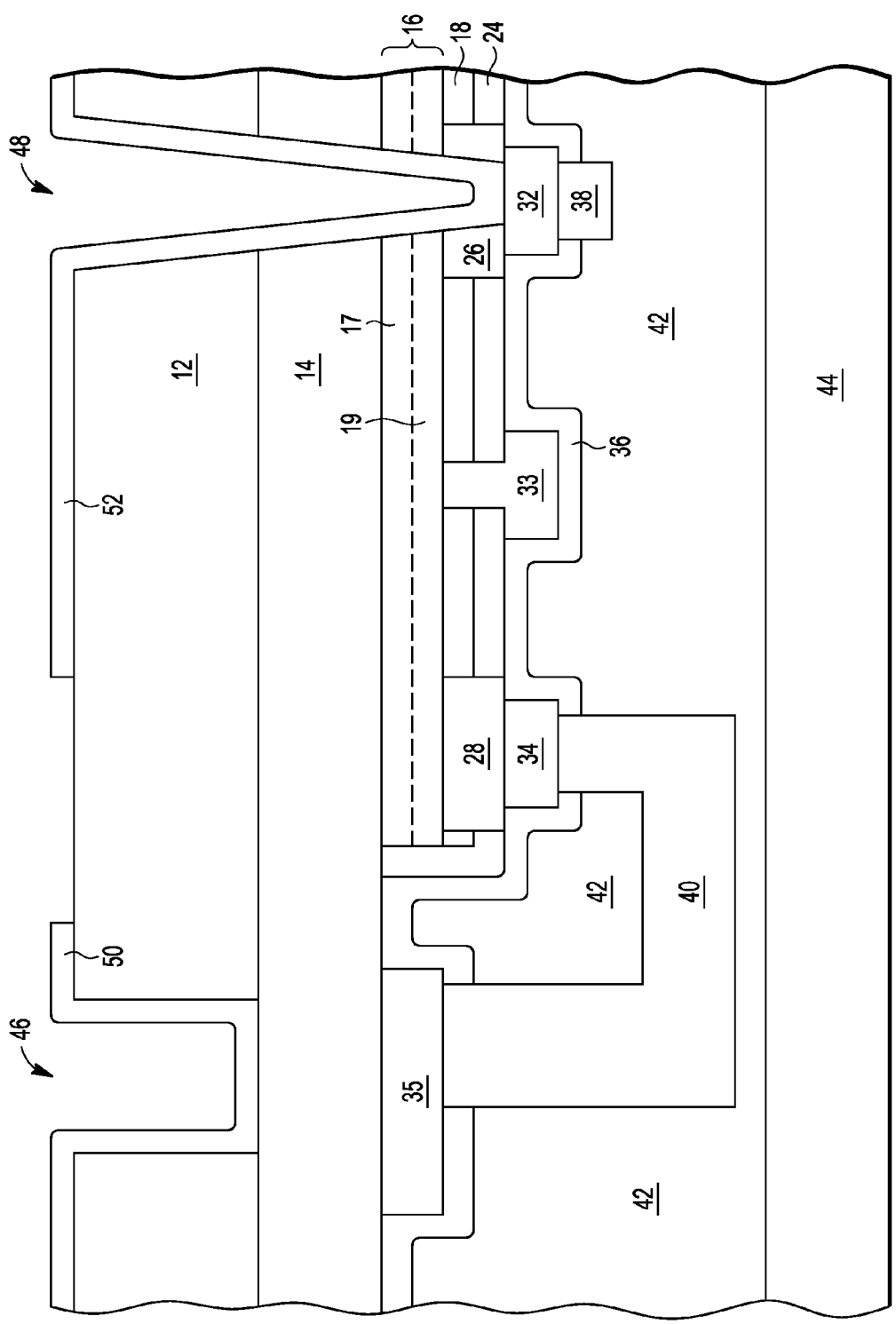
FIG. 8 illustrates the portion of the integrated circuit of FIG. 7 after forming back side vias in accordance with an embodiment.

After thinning the substrate 12, the substrate 12 is etched to form openings 46 and 48 and patterned metal layers 50 and 52 are formed within the openings 46 and 48, as illustrated in FIG. 8. In one embodiment, the substrate 12 is SiC and may be etched using a fluorine dry etch. Because SiC is difficult to etch, using current technology it could take multiple hours to etch through the substrate 12. The openings 46 and 48 may be etched in different processes, such as two different dry etch processes, and the area not being etched may be masked using nickel, for example. (not illustrated). In another embodiment, the openings 46 and 48 are formed using the same etch process. In this embodiment, a photoresist layer may be used to protect the GaN layer in the BAW region 22 during the etch. In one embodiment, the opening 46 is 10 to 1000 microns in width and 25 to 200 microns deep and the opening 48 is 25 to 100 microns in width and 25 to 70 microns deep. The opening 46 extends through the substrate 12. Because the opening 48 also extends through the GaN layer 14, the source/drain layer 16, and may extend through the source contact 26 (but does not have to), it is deeper and the sidewalls of the opening may slant more than the sidewalls of the opening 46 as a consequence of the etch process. Next the backside metal, such as Ti and Au multi-layer metal films, may be formed (e.g., by sputtering) and patterned using conventional techniques to result in the patterned metal layers 50 and 52. The patterned metal layer 50 forms the bottom electrode of the BAW device and the patterned metal layer 52 may be electrically and physically coupled to the first patterned metal layer 32 of the source of the GaN layer. This results in back side vias being formed. Although not illustrated, the patterned metal layer 50 may also extend into another back side via that extends through the substrate 12 and the GaN layer 14 to a patterned first metal layer that serves as a front side contact for the BAW bottom electrode (the patterned metal layer 50).

Figure 9:
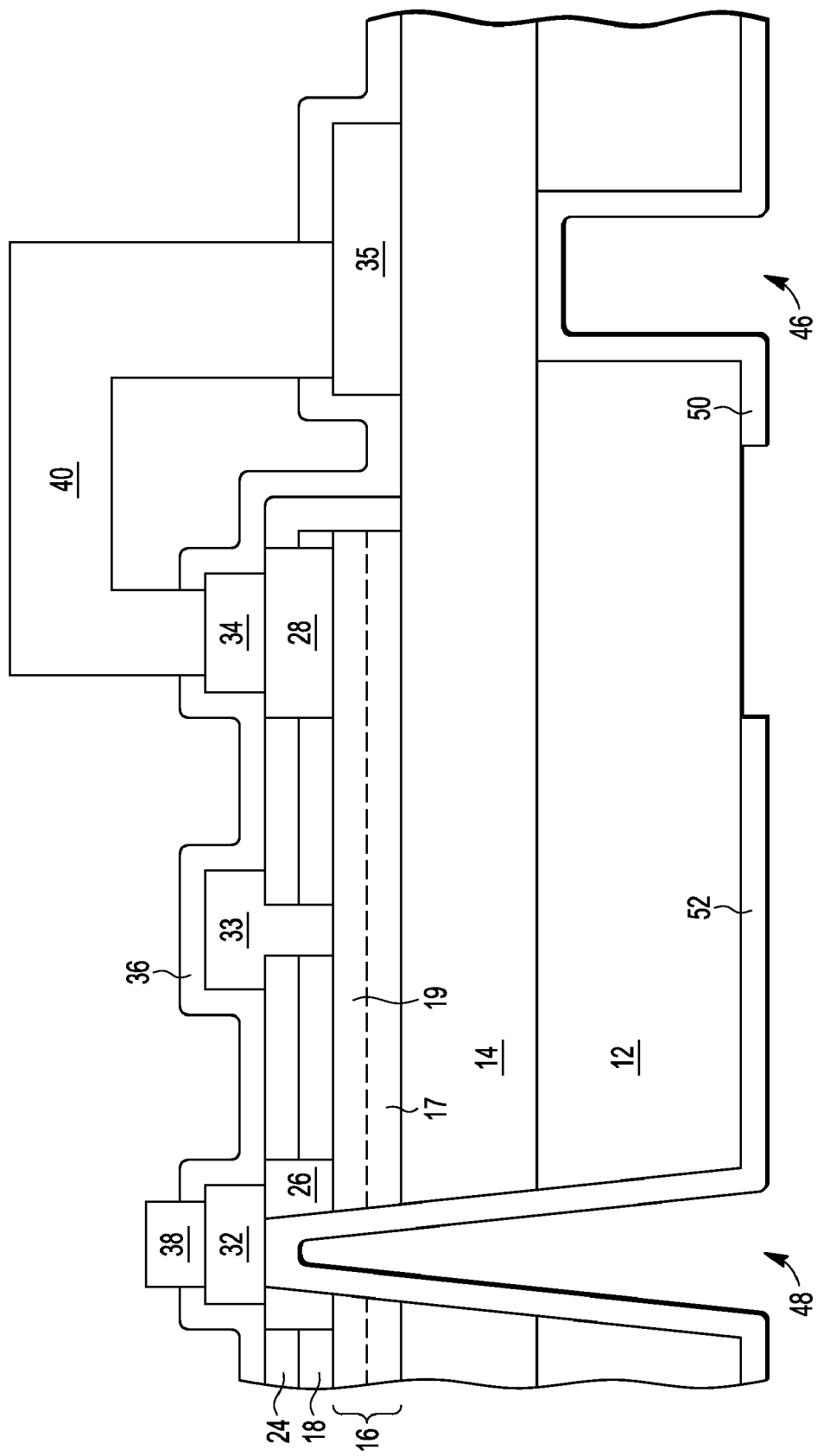
FIG. 9 illustrates the portion of the integrated circuit of FIG. 8 after removing the sacrificial layer and the carrier in accordance with an embodiment.

After forming the patterned metal layers 50 and 52, the carrier 44 and adhesion layer 42 are removed and the integrated circuit 10 may be flipped over so that the substrate 12 is on the bottom (closest to the floor), as illustrated in FIG. 9. The carrier 44 may be separated from the integrated circuit by dissolving the sacrificial layer 42 in a suitable chemical.

By now it should be appreciated that there has been provided a method for integrating a transistor with a BAW device. The transistor may be a GaN power amplifier or other microwave circuits such as low noise amplifiers, oscillators, mixers, diode detectors, or any other circuits that require the integration of transistors and filters. The BAW device may be a filter, for example. The transistor and BAW device are formed using an epitaxial GaN layer, which results in a high quality transistor and BAW device. The GaN layer serves as a resonator for the BAW device. The thickness of the GaN layer can be adjusted to achieve the desired frequency of operation of the BAW device without altering the performance of the GaN transistor. In addition to the epitaxially formed GaN layer the use of the backside vias allows for the BAW device to be integrated with the GaN transistor, forming a semiconductor device, such as a RF (radio frequency) front end functional block, that has improved noise figure, efficiency, and high frequency filter performance.

Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the integrated circuits described here can include GaN transistors configured as high power, high speed switches coupled to BAW devices used for transmitting and receiving high power RF signals. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method for making a structure using a substrate, a bulk GaN layer on a first surface of the substrate, wherein the bulk GaN layer has a GaN transistor region and a bulk acoustic wave (BAW) device region, and a source/drain layer over a first surface of the bulk GaN layer in the GaN transistor region, the method comprising:
    forming a gate electrode over the source/drain layer;
    forming a first BAW electrode over the first surface of the bulk GaN layer in the BAW device region;
    forming an opening in a second surface of the substrate, opposite the first surface of the substrate, wherein the opening extends through the substrate and exposes a second surface of the bulk GaN layer, opposite the first surface of the bulk GaN layer; and
    forming a second BAW electrode within the opening in the second surface of the substrate and in contact with the exposed second surface of the bulk GaN layer, wherein the first surface of the bulk GaN layer is between the source/drain layer and the second surface of the bulk GaN layer, and the first surface of the substrate is between the bulk GaN layer and the second surface of the substrate.

2. The method of claim 1, further comprising:
    forming a first source/drain contact over the source/drain layer;
    forming a second source/drain contact over the source/drain layer, wherein the gate electrode is between the first and second source/drain contact; and
    forming a second opening in the second surface of the substrate, wherein the second opening extends through the substrate, the bulk GaN layer, the source/drain layer, and the first source/drain contact.

3. The method of claim 2, further comprising:
forming a metal layer within the second opening and in contact with the first source/drain contact.

4. The method of claim 2, further comprising:
forming a metal interconnect connecting the second source/drain contact and the first BAW electrode.

5. The method of claim 1, wherein prior to the forming the opening in the second surface of the substrate, the method further comprises:
applying an adhesive material over the first surface of the substrate and attaching the adhesive material to a carrier.

6. The method of claim 1, wherein the source/drain layer further comprises a first layer over the bulk GaN layer, wherein the first layer comprises AlGaN, and a second layer over the first layer, wherein the second layer comprises GaN.

7. The method of claim 1, wherein the source/drain layer is over the first surface of the bulk GaN layer in the GaN transistor region and in the BAW device region, and wherein the method further comprises:
removing portions of the source/drain layer in the BAW device region prior to forming the first BAW electrode.

8. The method of claim 7, further comprising:
forming a first passivation layer over the source/drain layer prior to the removing the portions of the source/drain layer in the BAW device region; and
forming a second passivation layer over the first passivation layer after the removing the portions of the source/drain layer in the BAW device region.

9. The method of claim 1, wherein the substrate comprises SiC.

10. The method of claim 1, wherein the gate electrode and the first BAW electrode are formed from a same patterned metal layer.

11. A method comprising:
providing an epitaxially grown bulk GaN layer on a first surface of a substrate, wherein the bulk GaN layer has a GaN transistor region and a bulk acoustic wave (BAW) device region adjacent the GaN transistor region, and a source/drain layer over a first surface of the bulk GaN layer;
removing portions of the source/drain layer from the BAW device region;
forming a source contact over the source/drain layer and a drain contact over the source/drain layer;
forming a patterned metal layer over the source/drain layer in the GaN transistor region and over the first surface of the bulk GaN layer in the BAW device region, wherein the patterned metal layer comprises a first portion which forms a gate electrode over the source/drain layer in the GaN transistor region and a second portion which forms a first BAW electrode over the first surface of the bulk GaN layer in the BAW device region;

forming an opening in a second surface of the substrate, opposite the first surface of the substrate, wherein the opening extends through the substrate and exposes a second surface of the bulk GaN layer, opposite the first surface of the bulk GaN layer; and
forming a second BAW electrode within the opening in the second surface of the substrate and in contact with the exposed second surface of the bulk GaN layer, wherein the first surface of the bulk GaN layer is between the source/drain layer and the second surface of the bulk GaN layer, and the first surface of the substrate is between the bulk GaN layer and the second surface of the substrate.

12. The method of claim 11, further comprising:
forming a first passivation layer over the source/drain layer prior to the removing the portions of the source/drain layer in the BAW device region; and
forming a second passivation layer over the first passivation layer after the removing the portions of the source/drain layer in the BAW device region.

13. The method of claim 12, wherein prior to the forming the patterned metal layer, the method further comprises:
forming a second opening through the first passivation layer and the second passivation layer, wherein the second opening exposes the source/drain layer, and wherein the first portion of the patterned metal layer is located over the second opening and contacts the source/drain layer.

14. The method of claim 11, further comprising:
forming a second opening in the second surface of the substrate, wherein the second opening extends through the substrate, the bulk GaN layer, the source/drain layer, and the source contact.

15. The method of claim 14, further comprising:
forming a conductive layer within the second opening and in contact with the source contact.

16. The method of claim 14, further comprising:
forming a metal interconnect over the first surface of the substrate connecting the drain contact and the first BAW electrode.

17. The method of claim 11, wherein prior to the forming the opening in the second surface of the substrate, the method further comprises:
applying an adhesive material over the first surface of the substrate and attaching the adhesive material to a carrier.

18. The method of claim 11, wherein the source/drain layer further comprises a first layer over the bulk GaN layer, wherein the first layer comprises AlGaN, and a second layer over the first layer, wherein the second layer comprises GaN.

19. The method of claim 11, wherein the substrate comprises SiC.

* * * * *